United States Patent
Zhou et al.

(10) Patent No.: US 10,692,728 B2
(45) Date of Patent: Jun. 23, 2020

(54) USE OF SELECTIVE ALUMINUM OXIDE ETCH

(71) Applicant: Micromaterials LLC, Wilmington, DE (US)

(72) Inventors: Qingjun Zhou, San Jose, CA (US); Ying Zhang, Santa Clara, CA (US); Yung-Chen Lin, Gardena, CA (US)

(73) Assignee: MICROMATERIALS LLC, Wilmington, DE (US)

( * ) Notice: Subject to any disclaimer, the term of this patent is extended or adjusted under 35 U.S.C. 154(b) by 0 days.

(21) Appl. No.: 16/144,261

(22) Filed: Sep. 27, 2018

(65) Prior Publication Data

US 2019/0096666 A1 Mar. 28, 2019

Related U.S. Application Data

(60) Provisional application No. 62/564,027, filed on Sep. 27, 2017.

(51) Int. Cl.
| | |
|---|---|
| *H01L 21/308* | (2006.01) |
| *H01L 21/8234* | (2006.01) |
| *H01L 29/78* | (2006.01) |
| *H01L 29/66* | (2006.01) |
| *H01L 21/033* | (2006.01) |
| *H01L 21/02* | (2006.01) |
| *H01L 21/28* | (2006.01) |

(52) U.S. Cl.
CPC .... *H01L 21/3086* (2013.01); *H01L 21/02282* (2013.01); *H01L 21/0337* (2013.01); *H01L 21/28123* (2013.01); *H01L 21/823431* (2013.01); *H01L 29/66795* (2013.01); *H01L 29/785* (2013.01)

(58) Field of Classification Search
CPC ............. H01L 21/3086; H01L 21/0337; H01L 21/28123; H01L 21/02282; H01L 29/785; H01L 21/31144; H01L 21/31116; H01L 21/31127; H01L 21/0332; H01L 21/76802; H01L 21/0273; H01L 21/0334
See application file for complete search history.

(56) References Cited

U.S. PATENT DOCUMENTS

| | | | | |
|---|---|---|---|---|
| 8,889,560 | B2 * | 11/2014 | Chung | ................. H01L 21/0337 438/702 |
| 9,773,700 | B1 * | 9/2017 | Burns | ................ H01L 21/76897 |
| 9,865,473 | B1 * | 1/2018 | Ogino | ................ H01L 21/02164 |
| 9,881,794 | B1 * | 1/2018 | Su | ........................ H01L 21/0332 |
| 9,905,424 | B1 * | 2/2018 | Law | .................... H01L 21/0338 |

(Continued)

OTHER PUBLICATIONS

PCT International Search Report and Written Opinion in PCT/US2018/053110 dated Jan. 17, 2019, 10 pages.

*Primary Examiner* — Zandra V Smith
*Assistant Examiner* — Jeremy J Joy
(74) *Attorney, Agent, or Firm* — Servilla Whitney LLC

(57) ABSTRACT

Methods of forming and processing semiconductor devices which utilize the selective etching of aluminum oxide over silicon oxide and/or silicon nitride are described. Certain embodiments relate to the formation of fin-etched substrates. Other embodiments relate to the removal of source drain caps from substrates. Further embodiments relate to the processing of substrates comprising vias and/or metal contacts with bottom etch stop layers and/or liner layers.

17 Claims, 11 Drawing Sheets

(56) References Cited

U.S. PATENT DOCUMENTS

| | | | |
|---|---|---|---|
| 9,941,164 B1* | 4/2018 | Kim | H01L 21/76897 |
| 10,083,858 B2* | 9/2018 | Licausi | H01L 23/5283 |
| 2005/0112898 A1* | 5/2005 | Udayakumar | H01L 21/31116 |
| | | | 438/706 |
| 2008/0179660 A1* | 7/2008 | Edelstein | H01L 21/76829 |
| | | | 257/327 |
| 2008/0241575 A1* | 10/2008 | Lavoie | H01L 21/28562 |
| | | | 428/620 |
| 2011/0281426 A1* | 11/2011 | Kim | H01L 21/76804 |
| | | | 438/586 |
| 2013/0175583 A1* | 7/2013 | Yuan | H01L 23/485 |
| | | | 257/288 |
| 2013/0320412 A1* | 12/2013 | Yamasaki | H01L 21/321 |
| | | | 257/288 |
| 2014/0077305 A1* | 3/2014 | Pethe | H01L 21/76895 |
| | | | 257/368 |
| 2014/0170853 A1* | 6/2014 | Shamma | H01L 21/02115 |
| | | | 438/699 |
| 2014/0273446 A1* | 9/2014 | Huang | H01L 21/76816 |
| | | | 438/669 |
| 2015/0056800 A1* | 2/2015 | Mebarki | H01L 21/76885 |
| | | | 438/652 |
| 2015/0108589 A1* | 4/2015 | Cheng | H01L 29/511 |
| | | | 257/411 |
| 2015/0155171 A1* | 6/2015 | Chang | H01L 21/0338 |
| | | | 438/703 |
| 2015/0155198 A1 | 6/2015 | Tsai et al. | |
| 2015/0179578 A1 | 6/2015 | Jezewski et al. | |
| 2015/0214341 A1 | 7/2015 | Shin et al. | |
| 2015/0287636 A1* | 10/2015 | Wei | H01L 21/823878 |
| | | | 257/368 |
| 2016/0225640 A1 | 8/2016 | Raley et al. | |
| 2016/0268142 A1 | 9/2016 | Liou et al. | |
| 2017/0194211 A1* | 7/2017 | Lai | H01L 21/76897 |
| 2017/0317079 A1* | 11/2017 | Kim | H01L 29/0847 |
| 2019/0006515 A1* | 1/2019 | Cheng | H01L 21/76897 |
| 2020/0075335 A1* | 3/2020 | Lazzarino | H01L 21/31144 |

* cited by examiner

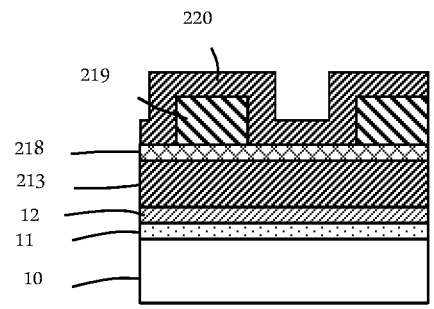 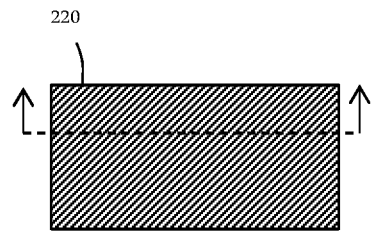
FIG. 20A  FIG. 20B
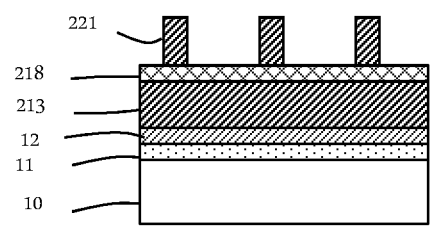 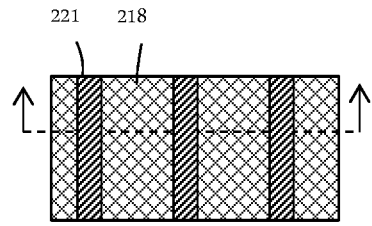
FIG. 21A  FIG. 21B
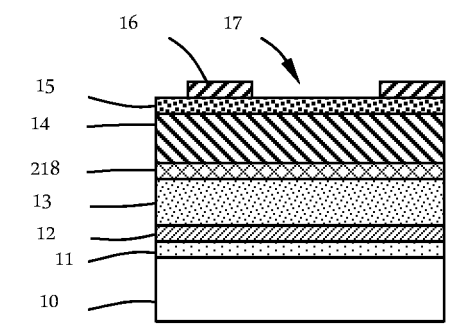 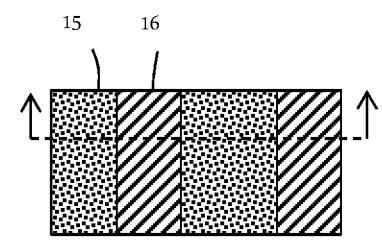
FIG. 22A  FIG. 22B
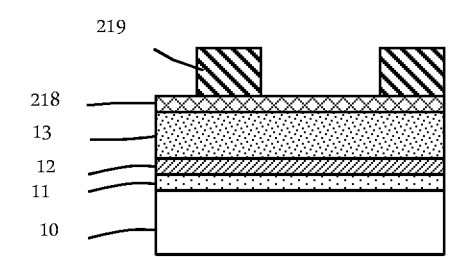 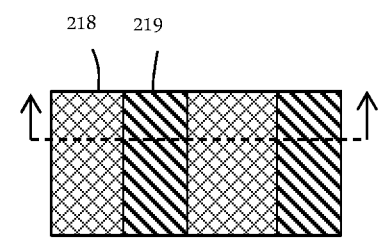
FIG. 23A  FIG. 23B

USE OF SELECTIVE ALUMINUM OXIDE ETCH

CROSS-REFERENCE TO RELATED APPLICATIONS

This application claims priority to U.S. Provisional Application No. 62/564,027, filed Sep. 27, 2018, the entire disclosure of which is hereby incorporated by reference herein.

TECHNICAL FIELD

Embodiments of the present invention pertain to the field of electronic device manufacturing and methods for device patterning. In particular, embodiments pertain to the use of selective etching of aluminum oxide in patterning and gate contact applications.

BACKGROUND

Reducing the size of integrated circuits (ICs) results in improved performance, increased capacity and/or reduced cost. Each size reduction requires more sophisticated techniques to form the ICs. Photolithography is commonly used to pattern ICs on a substrate. An exemplary feature of an IC is a line of a material which may be a metal, semiconductor or insulator. Linewidth is the width of the line and the spacing is the distance between adjacent lines. Pitch is defined as the distance between a same point on two adjacent lines. The pitch is equal to the sum of the linewidth and the spacing. Due to factors such as optics and light or radiation wavelength, however, photolithography techniques are restricted by a minimum pitch, below which a particular photolithographic technique may not reliably form features. Thus, the minimum pitch of a photolithographic technique can limit feature size reduction of ICs.

Processes such as self-aligned double patterning (SADP), self-aligned quad patterning (SAQP), and litho-etch-litho-etch (LELE) may be used for extending the capabilities of photolithographic techniques beyond the minimum pitch capabilities of existing lithographic equipment. Following the SADP, SAQP, or LELE process, multi-cut or block masks are placed over the lines and spaces generated by SADP, SAQP, or LELE processes to perform device patterning. As the feature size decreases, pitch and linewidth also decrease. Therefore the precision of mask edge placement control must be higher. For example, for a 7 nm node structure, the pitch is about 32 nm, and the cut or block mask's total edge placement errors (EPE) should be less than ¼ of the pitch, which is less than about 8 nm. Equipment capable of meeting such tight geometric requirements are extremely expensive, and additionally, such tight geometric requirements also contribute to low production yields.

Therefore, there is a need for improved methods for device patterning to reduce defects from pattern misalignment and increase production yields.

SUMMARY

One or more embodiments of the disclosure are directed to methods of forming a semiconductor device. A spin-on-carbon layer, a hardmask and a photoresist are formed on a film comprising alternating columns of spacer mandrels and gapfill materials with oxide films between. The photoresist has an opening over one of the gapfill materials. The hardmask and spin-on-carbon layer are etched through the opening in the photoresist to expose a top of one of the gapfill materials. The spin-on-carbon layer, hardmask and gapfill material are removed to leave a gap in the film. A spin-on-carbon layer, a hardmask and a photoresist are formed on the film comprising alternating columns of spacer mandrels, gapfill materials, oxide films and the gap. The photoresist has an opening over one of the spacer mandrels. The hardmask and spin-on carbon layer are etched through the opening in the photoresist to expose a top of one of the spacer mandrels. The spin-on-carbon layer, hardmask and spacer mandrel are removed to leave another gap. The oxide films are removed to leave spacer mandrels and gapfill materials on an etch stop layer on an oxide layer on a substrate. The etch stop layer and the oxide layer not covered by the spacer mandrels or gapfill materials are removed and a height of the spacer mandrels and gapfill materials are reduced to expose portions of the substrate. The expose portions of the substrate are fin etched and the remaining spacer mandrels, gapfill materials, etch stop layer and oxide layer are removed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIGS. 20A and 20B illustrate cross-sectional and top views, respectively, of an electronic device structure after forming a conformal spacer layer on the spin-on-carbon mandrels according to one or more embodiment of the disclosure;

FIGS. 21A and 21B illustrate cross-sectional and top views, respectively, of an electronic device structure after spacer etch and core removal according to one or more embodiment of the disclosure;

FIGS. 22A and 22B illustrate cross-sectional and top views, respectively, of an electronic device structure to provide aligned patterning according to one or more embodiment of the disclosure;

FIGS. 23A and 23B illustrate cross-sectional and top views, respectively, of an electronic device structure after forming mandrels in a SOC layer according to one or more embodiment of the disclosure;

DETAILED DESCRIPTION

Figure 1A:
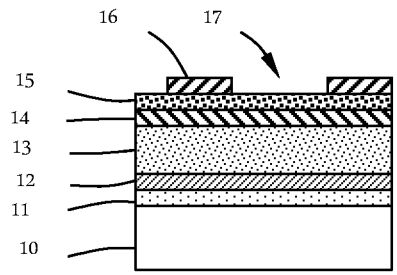
FIGS. 1A and 1B illustrate cross-sectional and top views, respectively, of an electronic device structure to provide aligned patterning according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in some embodiments" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

Edge Placement Error (EPE), for example, lithography overlay (OL), pitch walking, etc., make cutting schemes in patterning applications very challenging. Some embodiments of the disclosure advantageously provide methods to minimize or eliminate pattern misalignment. One or more embodiments of the disclosure provide methods using a two-color hardmask scheme using squared top spacers. Some embodiments of the disclosure provide methods that do not planarize multiple films simultaneously.

The embodiments of the disclosure are described by way of the Figures which illustrate a fin-cut process as exemplary process flows using a two-color (AB) hardmask flow. Those skilled in the art will understand that these fin-cut processes are merely illustrative of one possible use for the disclosed processes, and that the disclosed processes are not limited to fin-cut applications. Each of the FIGS. 1 through 40 is split into an A illustration (e.g., FIG. 1A) and a B illustration (e.g., FIG. 1B). The A illustration for each Figure is a side view of a portion of a device. The B illustration, except for FIG. 17B, is a top view of the portion of the device shown in the corresponding A illustration showing a cross-section line upon which the A illustration is shown. FIG. 17B is a perspective view of the device shown in FIG. 17A.

Figure 1B:
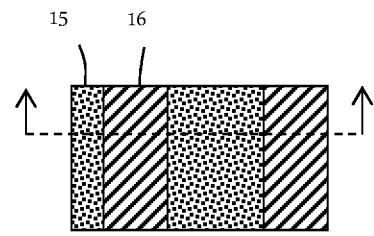

A first aspect of the disclosure may be referred to as a spacer-on-spacer AB mask with a cut-first fin etch. This aspect is illustrated in FIGS. 1 through 17, inclusive of both A and B illustrations. FIG. 1A shows a view of the device comprising a substrate 10, an oxide layer 11, an etch stop layer 12, an amorphous silicon layer 13, a spin-on-carbon (SOC) layer 14, a hard mask 15 and a photoresist 16 with opening 17. The individual layers or components of the device illustrated in FIG. 1A can be formed by any suitable processes known to the skilled artisan.

The substrate 10 can be any suitable substrate material. In one or more embodiments, the substrate 10 comprises a semiconductor material, e.g., silicon (Si), carbon (C), germanium (Ge), silicon germanium (SiGe), galloum arsenide (GaAs), InP, GaAs, InGaAs, InAlAs, other semiconductor material, or any combination thereof. In some embodiments, substrate 10 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate can be, e.g., an organic, a ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In some embodiments, substrate 10 includes one or more metallization interconnect layers for integrated circuits. In some embodiments, the substrate 10 includes interconnects, for example, vias, configured to connect the metallization layers. In at least some embodiments, the substrate 10 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate includes one or more buffer layers to accommodate for a lattice mismatch between the substrate 10 and one or more layers above substrate 10 and to confine lattice dislocations and defects.

The oxide layer 11 can be any suitable oxide layer. In one embodiment, oxide layer 11 comprises an interlayer dielectric (ILD). In one embodiment, oxide layer 11 comprises a low-k dielectric that includes, but is not limited to, materials such as, e.g., silicon dioxide, silicone oxide, carbon doped oxide ("CDO"), e.g., carbon doped silicon dioxide, porous silicon dioxide, silicon nitride, or any combination thereof.

In one embodiment, oxide layer 11 includes a dielectric material having k-value less than 5. In one embodiment, oxide layer 11 includes a dielectric material having k-values less than 2. In one embodiment, the thickness of the oxide layer 11 is in an approximate range from about 1 nanometer (nm) to about 2 microns (μm), or in the range of about 10 nm to about 1 micron.

In some embodiments, oxide layer 11 can be deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

The etch stop layer 12 can be any suitable material including, but not limited to, high-k dielectrics and ceramics materials. In some embodiments, the etch stop layer comprises an oxide, nitride, oxynitride, carbide, oxycarbide, carbonitride, oxycarbonitride, boride, oxyboride, boronitride, borocarbide, oxyborocarbide, oxyboronitride or oxyborocarbonitride of a d-block or f-block element. In some embodiments, the etch stop layer 12 comprises one or more of hafnium oxide, yttrium nitride, tin oxide or combinations thereof.

The etch stop layer 12 can be deposited by any suitable technique. In some embodiments, the etch stop layer 12 is deposited by atomic layer deposition. The thickness of the etch stop layer 12 can be in the range of about 1 nm to about 2 micron, or in the range of about 10 nm to about 1 micron.

A hardmask 15 may be deposited on the SOC layer 14, and a photoresist 16 having an opening 17 may be formed on the hardmask 15. The opening 17 may be formed in order to remove material disposed under an exposed portion of the hardmask 15.

Figure 2A:
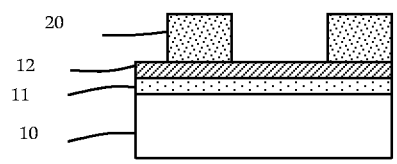
FIGS. 2A and 2B illustrate cross-sectional and top views, respectively, of an electronic device structure after forming mandrels in an amorphous silicon layer according to one or more embodiment of the disclosure.
Figure 2B:
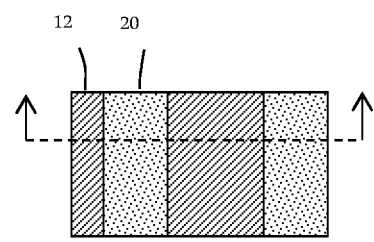

FIGS. 2A and 2B show the device after a core etch and hardmask removal. The SOC layer 14, hardmask 15 and photoresist 16 are removed. This can be done by one or more processes or in a single process. A mandrel 20 of amorphous silicon that was below the photoresist 16 remains and the etch stop layer 12 below opening 17 is exposed. As used in this specification, the directional terms such as "below", "under", "beneath" and the like, refer to the positions shown in the Figures and are used for descriptive purposes. Those skilled in the art will understand that the substrate can be held in any orientation within a processing chamber and that the directional terms are not limited to physical spatial orientation.

Figure 3A:
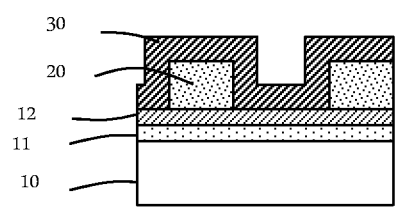
FIGS. 3A and 3B illustrate cross-sectional and top views, respectively, of an electronic device structure after forming a conformal spacer layer on an amorphous silicon layer according to one or more embodiment of the disclosure.
Figure 3B:
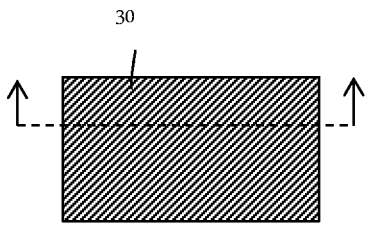

FIGS. 3A and 3B show the device after deposition of a spacer layer 30. The spacer layer 30 forms conformally on the amorphous silicon mandrel 20 and the etch stop layer 12. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

The spacer layer 30 of some embodiments comprises a nitride. In one or more embodiments, the spacer layer 30 comprises silicon nitride. In some embodiments, the spacer layer 30 is deposited by atomic layer deposition and has a thickness in the range of about 1 nm to about 2 micron, or in the range of about 10 nm to about 1 micron.

Figure 4A:
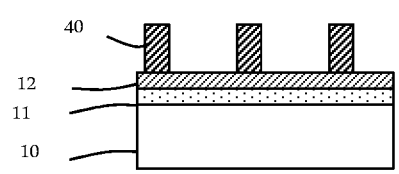
FIGS. 4A and 4B illustrate cross-sectional and top views, respectively, of an electronic device structure after spacer etch and core removal according to one or more embodiment of the disclosure.
Figure 4B:
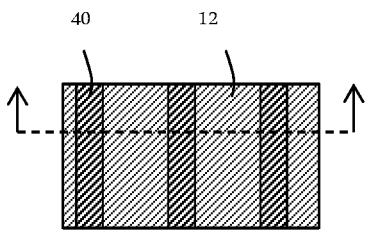

FIGS. 4A and 4B show the device after a spacer etch and core removal process. The portions of the spacer layer that were deposited on the sides of the mandrels remain as spacer mandrels 40. The etch stop layer 12 is again exposed by the spacer etch and core removal processes. The spacer etch and core removal process of some embodiments forms a square top spacer etch. The spacer layer 30 and the spacer layer mandrels 40 of some embodiments comprise silicon nitride.

Figure 5A:
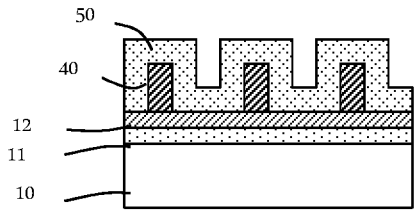
FIGS. 5A and 5B illustrate cross-sectional and top views, respectively, of an electronic device structure after forming a conformal spacer layer according to one or more embodiment of the disclosure.
Figure 5B:
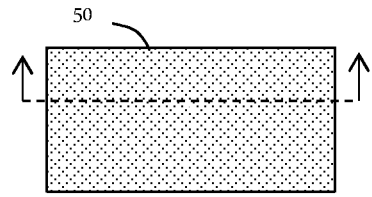

FIGS. 5A and 5B show the device after deposition of an oxide layer 50 on the spacer mandrels 40. The oxide layer 50 forms conformally on the spacer layer mandrels 40 and the etch stop layer 12. In some embodiments, the oxide layer 50 is deposited by atomic layer deposition. The oxide layer 50 of some embodiments comprises silicon oxide. In some embodiments, the oxide layer 50 has a thickness in the range of about 1 nm to about 2 micron, or in the range of about 10 nm to about 1 micron.

Figure 6A:
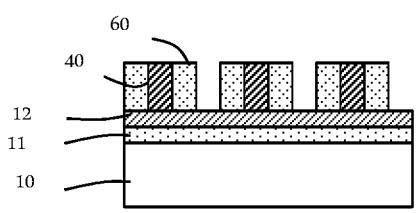
FIGS. 6A and 6B illustrate cross-sectional and top views, respectively, of an electronic device structure after etching the conformal spacer layer according to one or more embodiment of the disclosure.
Figure 6B:
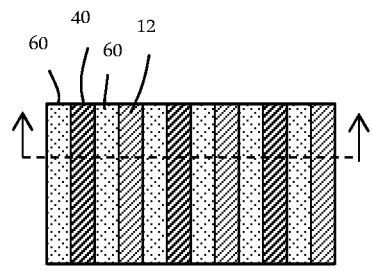

FIGS. 6A and 6B illustrate the device after an oxide spacer etch process that removes the horizontal portions of the oxide layer 50. The square top spacer etch process results in spacer layer mandrels 40 with oxide films 60 on either side. A gap 61 is formed between adjacent sets of oxide film 60/spacer layer mandrel 40/oxide film 60. In the embodiment illustrated, a silicon nitride material is surrounded by silicon oxide layers.

Figure 7A:
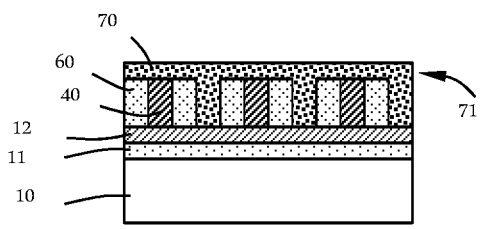
FIGS. 7A and 7B illustrate cross-sectional and top views, respectively, of an electronic device structure after gapfilling according to one or more embodiment of the disclosure.
Figure 7B:
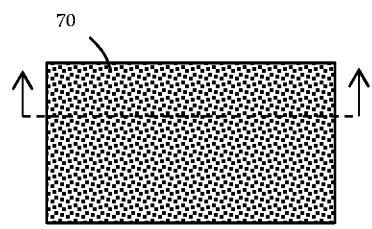

FIGS. 7A and 7B show the device after deposition of a gapfill material 70 on the exposed etch stop layer 12 in the gaps 61 between the sets of oxide films 60 and spacer layer mandrels 40. The gapfill material 70 is deposited in a sufficient amount to form an overburden 71 that covers the tops of the oxide films 60 and the spacer layer mandrels 40. The gapfill material 70 is deposited on the opposing sidewalls and top portions of the oxide films 60 and spacer layer mandrels 40.

The gapfill material 70 can be deposited by any suitable technique. In some embodiments, the gapfill material 70 is deposited by atomic layer deposition. The gapfill material 70 is a sacrificial material and can be formed with or without a seam. In some embodiments, the gapfill material 70 comprises aluminum oxide.

Figure 8A:
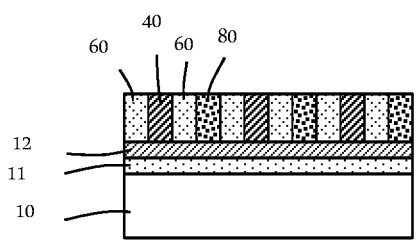
FIGS. 8A and 8B illustrate cross-sectional and top views, respectively, of an electronic device structure after CMP or etchback of the overburden after gapfilling according to one or more embodiment of the disclosure.
Figure 8B:
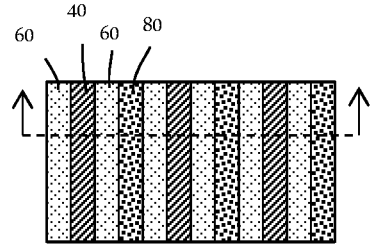

FIGS. 8A and 8B show the device after removal of the gapfill material 70 overburden to leave the gapfill material 80 in the gaps 61. The removal process results in a surface in which there are exposed portions of the oxide films 60, spacer layer mandrels 40 and gapfill materials 80. The overburden can be removed by a chemical-mechanical planarization process or b an etchback process.

Figure 9A:
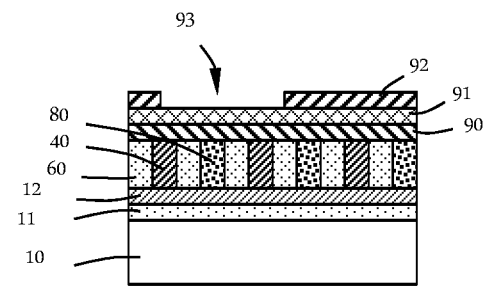
FIGS. 9A through 11B illustrate cross-sectional (A) and top views (B) of an electronic device structure using a wide overlay mask to remove one gapfill material according to one or more embodiment of the disclosure.
Figure 9B:
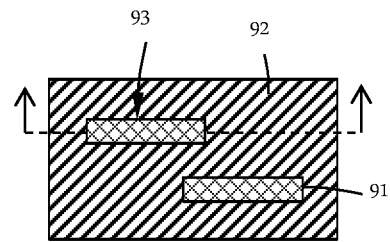

FIGS. 9A and 9B show the device after a spin-on-carbon (SOC) film 90, a hardmask 91 and a photoresist 92 with an opening 93 are deposited. The opening 93 in the photoresist 92 is over one column of gapfill material 80, however more than one column of gapfill material 80 could be included. The hardmask 91 and photoresist 92 can be any suitable material. In some embodiments, the hardmask 91 and photoresist 92 are the same materials as hardmask 15 and photoresist 16, respectively. In some embodiments, one or both of the hardmask 91 and the photoresist 92 are different than hardmask 15 and photoresist 16, respectively. FIG. 9B shows a top view of the photoresist 92 with openings 93 revealing hardmask 91.

In one embodiment, hardmask 91 is a metallization layer hard mask. In some embodiments, hardmask 91 is a carbon hard mask, a metal oxide hard mask layer, a metal nitride hard mask layer, a silicon nitride hard mask layer, a silicon oxide hard mask layer, a carbide hard mask layer, or other hard mask layer known to one of ordinary skill in the art of microelectronic device manufacturing. In one embodiment, the hardmask 91 is formed using one or more hard mask patterning techniques known to one of ordinary skill in the art of microelectronic device manufacturing.

In one embodiment, photoresist 92 is deposited using one or more mask layer deposition techniques known to one of ordinary skill in the art of microelectronic device manufacturing. In one embodiment, photoresist 92 is deposited using one of deposition techniques, such as but not limited to a CVD, PVD, MBE, NOCVD, spin-on, or other insulating layer deposition techniques known to one of ordinary skill in the art of microelectronic device manufacturing. In one embodiment, the opening 93 is formed using one or more of the patterning and etching techniques known to one of ordinary skill in the art of microelectronic device manufacturing.

Figure 10A:
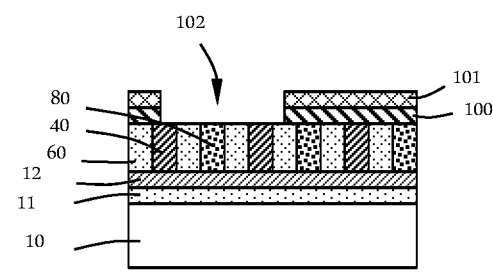
Figure 10B:
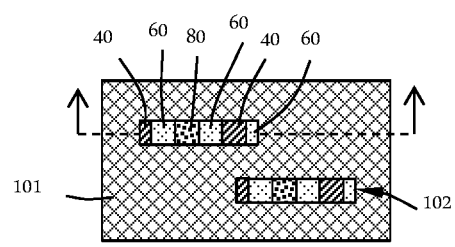

FIGS. 10A and 10B illustrate the device after a mask opening to form SOC layer 100 and hardmask 101, and removal of the photoresist 92. The opening 102 is vertically aligned with the opening 93 in the photoresist 92.

Figure 11A:
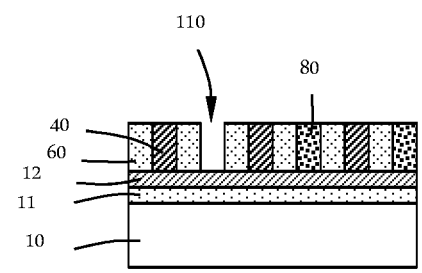
Figure 11B:
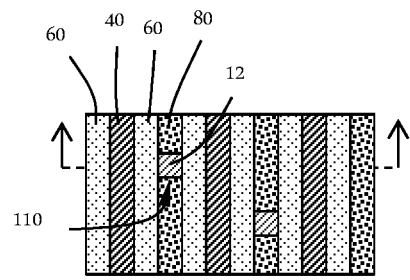

FIGS. 11A and 11B show the device after removal of the SOC layer 100, hardmask 101 and the gapfill material 80 to leave a gap 110. The gapfill material 80 can be removed by a selective etch process that does not affect spacer layer mandrel 40 or oxide film 60. In some embodiments, the spacer layer mandrel 40 comprises silicon nitride, the oxide film 60 comprises silicon oxide and the gapfill material 80 comprises aluminum oxide.

The selectivity of an etching process is generally expressed as a ratio of etch rates. For example, if one material (e.g. aluminum oxide) is etched 25 times faster than other materials, the process would be described as having a selectivity of 25:1 or simply 25. In this regard, higher ratios/values indicate more selective etch processes. In some embodiments, the selective etch process which removes the gapfill material 80 has a selectivity greater than or equal to about 10, greater than or equal to about 12, greater than or equal to about 15, greater than or equal to about 20, or greater than or equal to about 25. In some embodiments, the selective etch process has a selectivity of about 12.

Figure 12A:
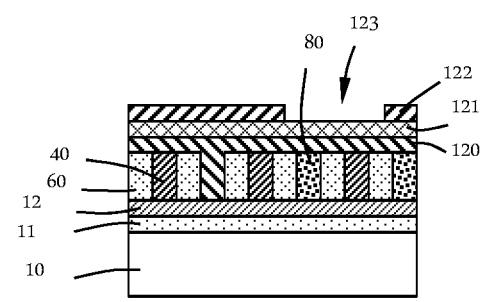
FIGS. 12A through 14B illustrate cross-sectional (A) and top views (B) of an electronic device structure using a wide overlay mask to remove one spacer mandrel according to one or more embodiment of the disclosure.
Figure 12B:
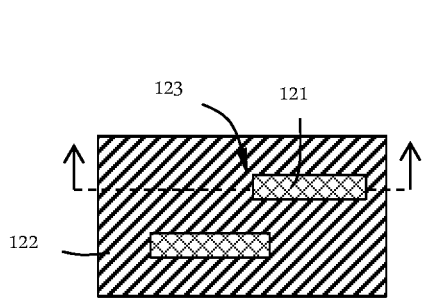

FIGS. 12A and 12B show the device after a spin-on-carbon (SOC) film 120, a hardmask 121 and a photoresist 122 with an opening 123 are deposited. The opening 123 in the photoresist 122 is over one column of spacer layer mandrel 40, however more than one column of spacer layer mandrel 40 could be included. The hardmask 121 and photoresist 122 can be any suitable material.

Figure 13A:
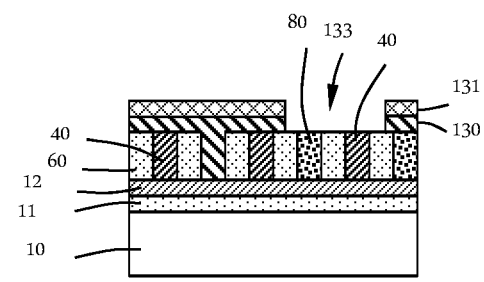
Figure 13B:
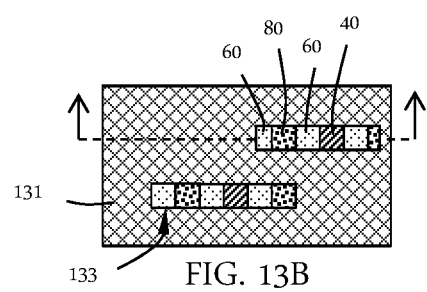

FIGS. 13A and 13B illustrate the device after a mask opening to form SOC layer 130 and hardmask 131, and removal of the photoresist 122. The opening 133 is vertically aligned with the opening 123 in the photoresist 122.

Figure 14A:
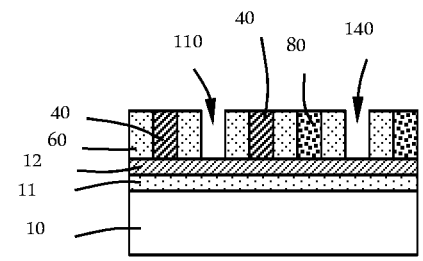
Figure 14B:
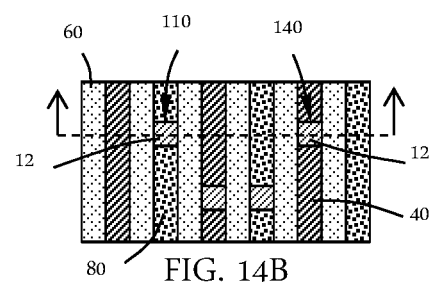

FIGS. 14A and 14B show the device after removal of the SOC layer 130, hardmask 131 and the exposed spacer layer mandrel 40 to leave a gap 140. The spacer layer can be removed by a selective etch process that does not affect gapfill material 80 or oxide film 60.

Figure 15A:
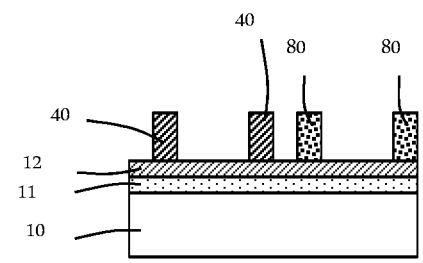
FIGS. 15A and 15B illustrate cross-sectional and top views, respectively, of an electronic device structure after removal of the oxide spacers according to one or more embodiment of the disclosure.
Figure 15B:
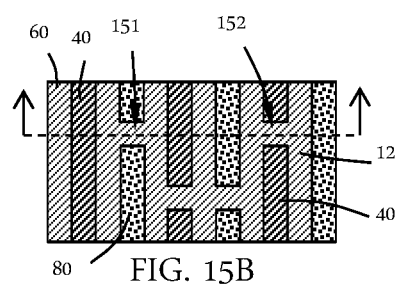

FIGS. 15A and 15B show the device after an oxide spacer removal process. The oxide films 60 are removed exposing the etch stop layer 12.

Figure 16A:
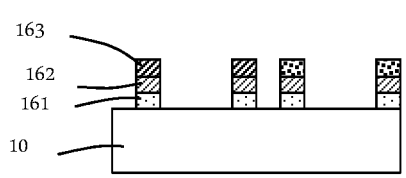
FIGS. 16A and 16B illustrate cross-sectional and top views, respectively, of an electronic device structure after oxide mask etching according to one or more embodiment of the disclosure.
Figure 16B:
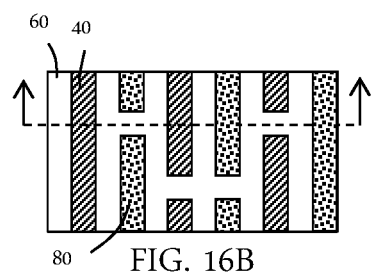

FIGS. 16A and 16B show the device after an oxide mask etch. The exposed etch stop layer 12 and oxide layer 11 below the exposed etch stop layer 12 are removed. The thickness of the removed layers is also removed from the tops of the spacer layer mandrels 40 and gapfill materials 80. The pattern of spacer layer mandrels 40 and gapfill materials 80 can be transferred to the substrate 10.

Figure 17A:
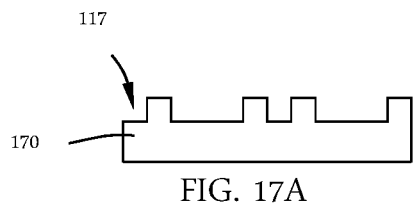
FIGS. 17A and 17B illustrate cross-sectional and perspective views, respectively, of an electronic device structure after fin etching and mask removal according to one or more embodiment of the disclosure.
Figure 17B:
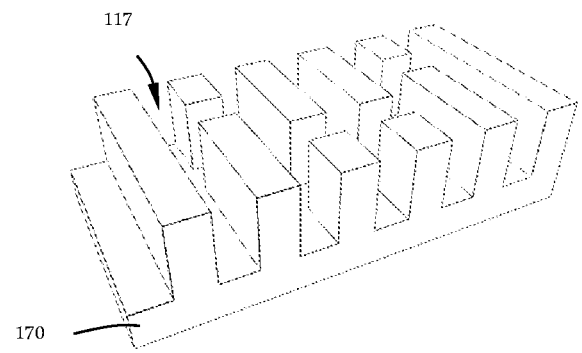

FIGS. 17A and 17B show the device after pattern transfer to the substrate 10 to reveal patterned substrate 170. The depth of the recess 117 of some embodiments is in the range of about 10 nm to about 2000 nm, or in the range of about 50 nm to about 1000 nm, or in the range of about 100 nm to about 500 nm, or about 200 nm.

Figure 18A:
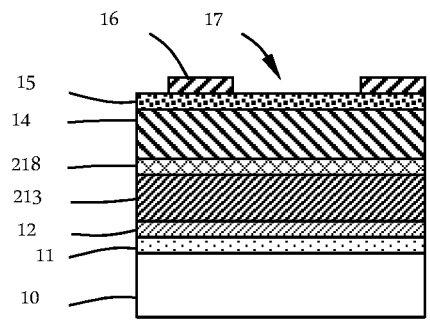
FIGS. 18A and 18B illustrate cross-sectional and top views, respectively, of an electronic device structure to provide aligned patterning according to one or more embodiment of the disclosure.
Figure 18B:
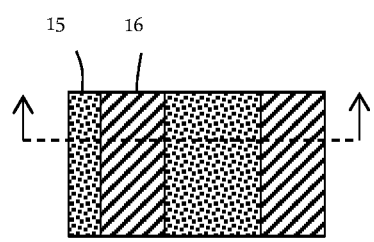

A second aspect of the disclosure may be referred to as a transfer etch AB mask with a cut-first Fin etch. This aspect is illustrated by FIGS. 18 through 21, followed by FIGS. 4 to 17, inclusive of both A and B illustrations. FIG. 18A shows a view of the device comprising a substrate 10, an oxide layer 11, an etch stop layer 12, a silicon nitride layer 213, a second etch stop layer 218, a spin-on-carbon (SOC) layer 14, a hard mask 15 and a photoresist 16 with opening 17. The individual layers or components of the device illustrated in FIG. 18A can be formed by any suitable processes known to the skilled artisan. FIG. 18B shows a top view of the device of FIG. 18A in which the hardmask 15 and photoresists 16 are visible. The substrate 10, oxide layer 11, etch stop layer 12, SOC layer 14, hardmask 15 and photoresist 16 are described above.

The silicon nitride layer 213 can be any suitable thickness deposited by any suitable technique known to the skilled artisan. In some embodiments, the thickness of the silicon nitride layer 213 is in the range of about 10 nm to about 2000 nm, or in the range of about 100 nm to about 1000 nm.

The second etch stop layer 217 can be the same as the etch stop layer 12 or different. The second etch stop layer 217 can be any suitable material including, but not limited to, high-k dielectrics and ceramics materials. In some embodiments, the second etch stop layer 217 comprises an oxide, nitride, oxynitride, carbide, oxycarbide, carbonitride, oxycarbonitride, boride, oxyboride, boronitride, borocarbide, oxyborocarbide, oxyboronitride or oxyborocarbonitride of a d-block or f-block element. In some embodiments, the second etch stop layer 217 comprises one or more of hafnium oxide, yttrium nitride, tin oxide or combinations thereof.

The second etch stop layer 217 can be deposited by any suitable technique. In some embodiments, the second etch stop layer 217 is deposited by atomic layer deposition. The thickness of the second etch stop layer 217 can be in the range of about 1 nm to about 2 micron, or in the range of about 10 nm to about 1 micron.

Figure 19A:
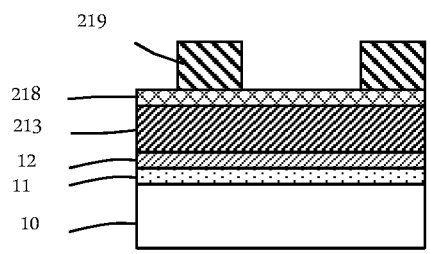
FIGS. 19A and 19B illustrate cross-sectional and top views, respectively, of an electronic device structure after forming mandrels in a spin-on-carbon layer according to one or more embodiment of the disclosure.
Figure 19B:
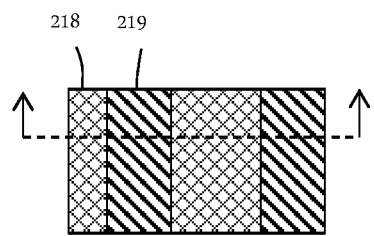

FIGS. 19A and 19B illustrate the device after the SOC layer 14 has been etched to form an SOC mandrel 219 and the photoresist 16 and hard mask 15 have been removed. The portion of the SOC layer 14 that was under the opening 17 has been removed to reveal the second etch stop layer 218. Again, the directional relationship "under" is used for descriptive purposes relative to the Figures only and does not imply a physical direction in a processing chamber.

FIGS. 20A and 20B illustrate the device after deposition of a conformal oxide spacer 220 on the exposed second etch stop layer 218 and the SOC mandrels 219. The conformal oxide spacer 220 of some embodiments is a silicon oxide layer deposited by atomic layer deposition. The thickness of the conformal oxide spacer 220 can be in the range of about 1 nm to about 2000 nm, or in the range of about 2 nm to about 1000 nm.

FIGS. 21A and 21B illustrate the device after a spacer etch and core removal process. The portions of the spacer 220 that were deposited on the sides of the mandrels 219 remain as spacer mandrels 221. The second etch stop layer 218 is again exposed by the spacer etch and core removal process. The spacer etch and core removal process of some embodiments forms a square top mandrel.

After formation of the spacer mandrels 221, a transfer etch process can be performed to remove the spacer mandrels 221, the second etch stop layer 218 and portions of the silicon nitride layer 213 to leave mandrels 40 in the silicon nitride layer 213. These mandrels 40 are shown in FIGS. 4A and 4B. The method of the second aspect is then completed following the embodiments described with respect to FIGS. 5 through 17, inclusive of both the A and B designations to form a substrate 170 illustrated in FIGS. 17A and 17B.

A third aspect of the disclosure may be referred to as a transfer etch and replaced core AB mask with a cut-first Fin etch. This aspect is illustrated by FIGS. 22 through 32, followed by FIGS. 8 to 17, inclusive of both A and B illustrations. FIG. 22A shows a view of the device comprising a substrate 10, an oxide layer 11, an etch stop layer 12, an amorphous silicon layer 13, a second etch stop layer 218, a spin-on-carbon (SOC) layer 14, a hard mask 15 and a photoresist 16 with opening 17. The device embodied by the third aspect is similar to that of the second aspect with the silicon nitride layer 213 being replaced by the amorphous silicon layer 13. The individual layers or components of the device illustrated in FIG. 22A can be formed by any suitable processes known to the skilled artisan. FIG. 22B shows a top view of the device of FIG. 22A in which the hardmask 15 and photoresists 16 are visible. The substrate 10, oxide layer 11, etch stop layer 12, amorphous silicon layer 13, SOC layer 14, hard mask 15 and photoresist 16 are described above with respect to the first aspect of the disclosure. The second etch stop layer 218 is described above with respect to the second aspect of the disclosure.

FIGS. 23A and 23B illustrate the device after the SOC layer 14 has been etched to form an SOC mandrel 219 and the photoresist 16 and hard mask 15 have been removed. The portion of the SOC layer 14 that was under the opening 17 has been removed to expose the second etch stop layer 218. Again, the directional relationship "under" is used for descriptive purposes relative to the Figures only and does not imply a physical direction in a processing chamber.

Figure 24A:
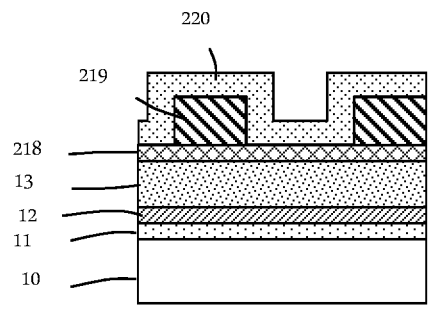
FIGS. 24A and 24B illustrate cross-sectional and top views, respectively, of an electronic device structure after forming a conformal spacer layer on the SOC mandrels according to one or more embodiment of the disclosure.
Figure 24B:
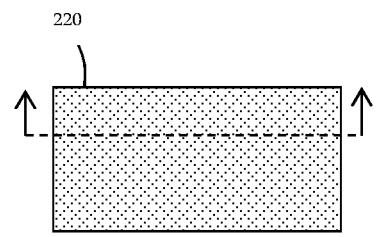

FIGS. 24A and 24B illustrate the device after deposition of a conformal oxide spacer 220 on the exposed second etch stop layer 218 and the SOC mandrels 219. The conformal oxide spacer 220 of some embodiments is a silicon oxide layer deposited by atomic layer deposition. The thickness of the conformal oxide spacer 220 can be in the range of about 1 nm to about 2000 nm, or in the range of about 2 nm to about 1000 nm.

Figure 25A:
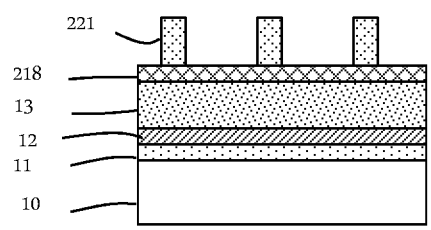
FIGS. 25A and 25B illustrate cross-sectional and top views, respectively, of an electronic device structure after spacer etch and core removal according to one or more embodiment of the disclosure.
Figure 25B:
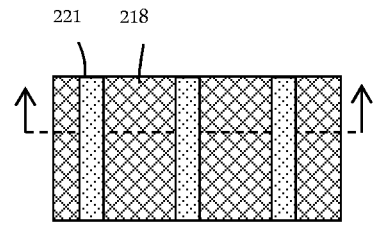

FIGS. 25A and 25B illustrate the device after a spacer etch and core removal process. The portions of the spacer 220 that were deposited on the sides of the mandrels 219 remain as spacer mandrels 221. The second etch stop layer 218 is again exposed by the spacer etch and core removal process. The spacer etch and core removal process of some embodiments forms a square top mandrel.

Figure 26A:
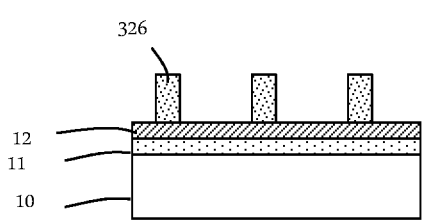
FIGS. 26A and 26B illustrate cross-sectional and top views, respectively, of an electronic device structure after mandrel transfer to an amorphous silicon layer according to one or more embodiment of the disclosure.
Figure 26B:
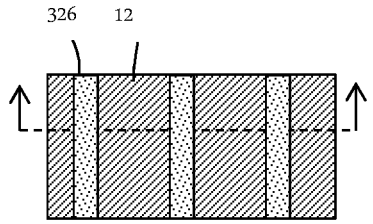

FIGS. 26A and 26B show the device after a transfer etch process removes the spacer mandrels 221, the second etch stop layer 218 and portions of the amorphous silicon layer 13 to leave mandrels 326 of amorphous silicon. The transfer etch process can include one or more process conditions known to the skilled artisan. Portions of the etch stop layer 12 are exposed by the transfer etch. The transfer etch process of some embodiments forms a square top mandrel.

Figure 27A:
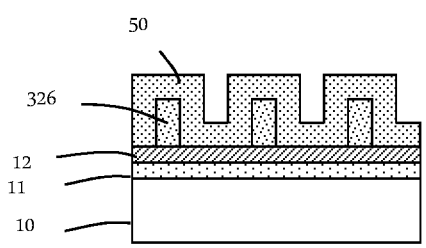
FIGS. 27A and 27B illustrate cross-sectional and top views, respectively, of an electronic device structure after forming a conformal spacer layer on an amorphous silicon mandrels according to one or more embodiment of the disclosure.
Figure 27B:
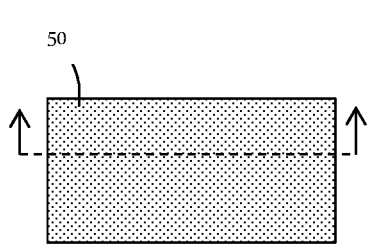

FIGS. 27A and 27B illustrate the device after deposition of a conformal oxide spacer 50 on the exposed etch stop layer 12 and the mandrels 326. The conformal oxide spacer 50 of some embodiments is a silicon oxide layer deposited by atomic layer deposition. The thickness of the conformal oxide spacer 50 can be in the range of about 1 nm to about 2000 nm, or in the range of about 2 nm to about 1000 nm.

Figure 28A:
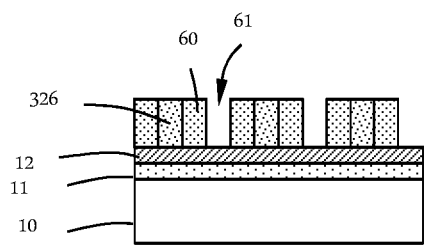
FIGS. 28A and 28B illustrate cross-sectional and top views, respectively, of an electronic device structure after spacer etch and core removal according to one or more embodiment of the disclosure.
Figure 28B:
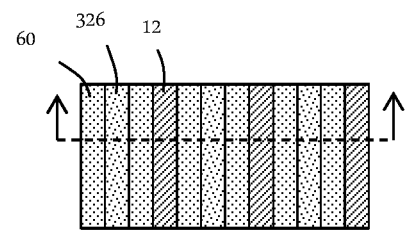

FIGS. 28A and 28B illustrate the device after an oxide spacer etch process removes the portions of the oxide spacer 50 on top of the mandrels 326 and on the etch stop layer 12, leaving the oxide films 60 the sides of the mandrels 326 and gaps 61 between adjacent sets of oxide film 60/mandrel 326/oxide film 60, as shown. In some embodiments, the oxide spacer etch process forms a square top mandrel.

Figure 29A:
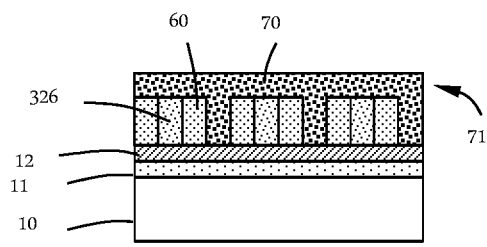
FIGS. 29A and 29B illustrate cross-sectional and top views, respectively, of an electronic device structure after gapfilling according to one or more embodiment of the disclosure.
Figure 29B:
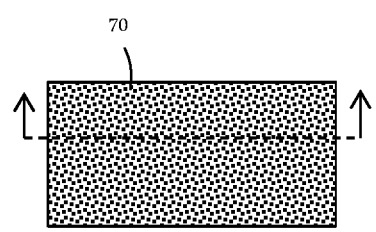

FIGS. 29A and 29B show the device after deposition of a gapfill material 70 on the exposed etch stop layer 12 in the gaps 61 between the sets of oxide films 60 and mandrels 326. The gapfill material 70 is deposited in a sufficient amount to form an overburden 71 that covers the tops of the oxide films 60 and the mandrels 326. The gapfill material 70 is deposited on the opposing sidewalls and top portions of the oxide films 60 and mandrels 326.

The gapfill material 70 can be deposited by any suitable technique. In some embodiments, the gapfill material 70 is deposited by atomic layer deposition. The gapfill material 70 is a sacrificial material and can be formed with or without a seam. In some embodiments, the gapfill material 70 comprises aluminum oxide.

Figure 30A:
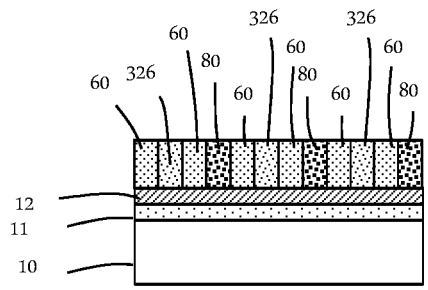
FIGS. 30A and 30B illustrate cross-sectional and top views, respectively, of an electronic device structure after CMP or etchback of the overburden after gapfilling according to one or more embodiment of the disclosure.
Figure 30B:
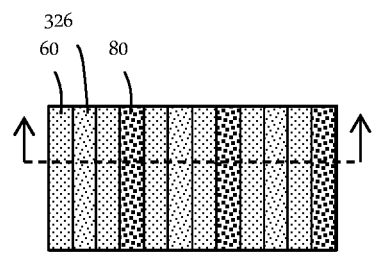

FIGS. 30A and 30B show the device after removal of the gapfill material 70 overburden 71 to leave the gapfill material 80 in the gaps 61. The removal process results in a surface in which there are exposed portions of the oxide films 60, mandrels 326 and gapfill materials 80. The overburden can be removed by a chemical-mechanical planarization process or b an etchback process.

Figure 31A:
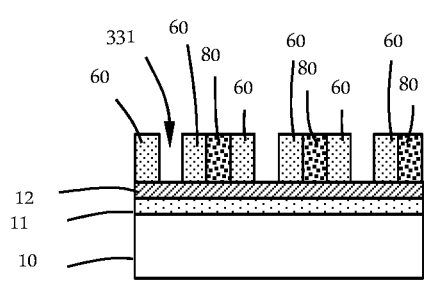
FIGS. 31A and 31B illustrate cross-sectional and top view, respectively, of an electronic device structure after removal of amorphous silicon mandrels according to one or more embodiment of the disclosure.
Figure 31B:
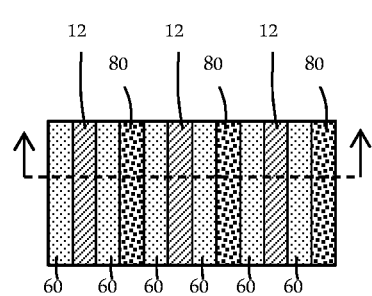

FIGS. 31A and 31B show the device after removal of the amorphous silicon mandrels 326 to leave gaps 331 between adjacent oxide films 60 to leave the etch stop layer 12 exposed at the bottom of the gaps 331. The amorphous silicon mandrels 326 can be removed by any suitable process known to those skilled in the art. In some embodiments, the amorphous silicon mandrels 326 are removed by a selective etch process.

Figure 32A:
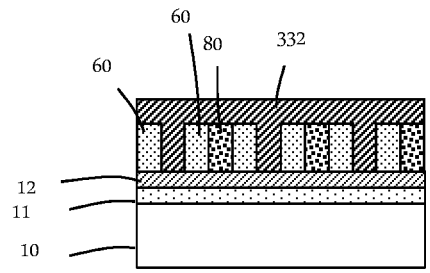
FIGS. 32A and 32B illustrate cross-sectional and top views, respectively, of an electronic device structure after gapfilling according to one or more embodiment of the disclosure.
Figure 32B:
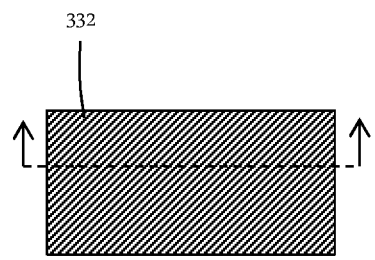

FIGS. 32A and 32B show the device after gapfilling with silicon nitride 332. The gapfill process can form an overburden on the surface of the substrate, as illustrated. The removal process results in a surface in which there are exposed portions of the oxide films 60, spacer layer mandrels 40 and gapfill materials 80. The overburden can be removed by a chemical-mechanical planarization process or by an etchback process. The method of the third aspect is then completed following the embodiments described with respect to FIGS. 9 through 17, inclusive of both the A and B designations to form a substrate 170 illustrated in FIGS. 17A and 17B.

A fourth aspect of the disclosure may be referred to as a spacer-on-spacer AB mask with a cut-last Fin etch. This aspect is illustrated by a process that proceeds from FIGS. 1 through 8, followed by FIGS. 33 through 40, ending in FIG. 17, inclusive of both A and B illustrations. After proceeding through the process described with respect to FIGS. 1 through 8, a device with alternating spacer layer mandrels 40 and gapfill materials 80 with oxide films 60 between.

Figure 33A:
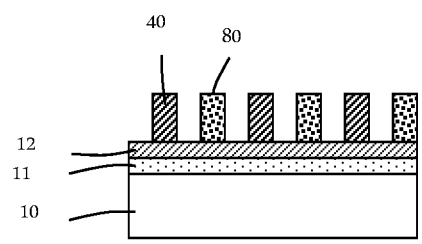
FIGS. 33A and 33B illustrate cross-sectional and top views, respectively, of an electronic device structure after oxide spacer removal according to one or more embodiment of the disclosure.
Figure 33B:
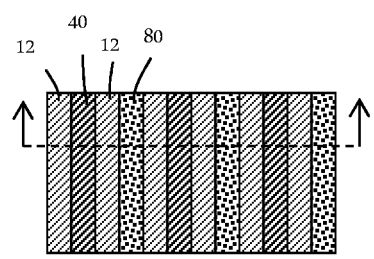

FIGS. 33A and 33B show a view of the device after the oxide films 60 have been removed to expose the etch stop layer 12 in the gaps between the spacer layer mandrels 40 and the gapfill materials 80. The oxide films 60 can be removed by any suitable process known to the skilled artisan.

Figure 34A:
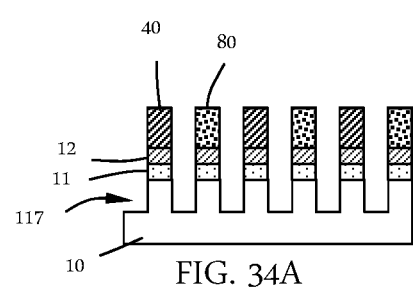
FIGS. 34A and 34B illustrate cross-sectional and top views, respectively, of an electronic device structure after a fin etch to form a grating structure according to one or more embodiment of the disclosure.
Figure 34B:
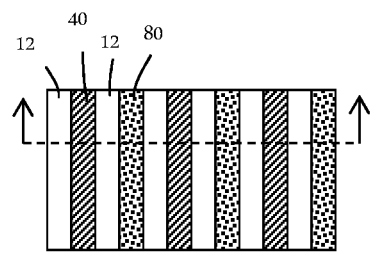

FIGS. 34A and 34B show a view of the device after a fin etch removes the etch stop layer 12 and oxide layer 11 in the gaps between the mandrels 40 and the gapfill materials 80. This results in a grating structure in which the substrate 10 has recesses 117.

Figure 35A:
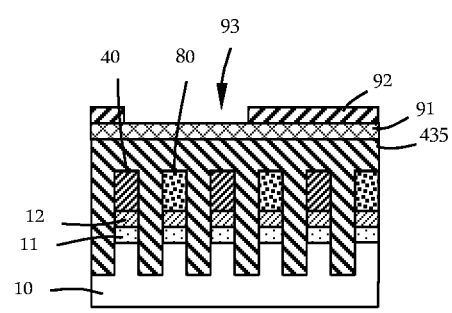
FIGS. 35A through 37B illustrate cross-sectional (A) and top views (B) of an electronic device structure using a wide overlay mask to remove one gapfill material topped stack according to one or more embodiment of the disclosure.
Figure 35B:
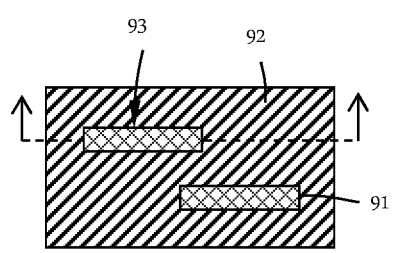

FIGS. 35A and 35B show the device after a SOC layer 435 has been deposited to fill the gaps between the film stacks topped by the mandrels 40 and the gap fill materials 80. The SOC layer 435 is deposited to have an overburden that covers the tops of the mandrels 40 and the gap fill materials 80. A hardmask 91 is formed on the SOC layer 435 and a photoresist 92 with opening 93 is formed on the hardmask 91. The opening 93 is positioned over one of the film stacks topped with the gapfill material 80 and may extend over the film stacks topped with the mandrels 40.

In one or more embodiment, hardmask 91 includes one or more hard mask layers. In one embodiment, hardmask 91 is a tri-layer mask stack, e.g., a 193 nm immersion (193i) or EUV resist mask on a middle layer (ML) (e.g., a silicon containing organic layer or a metal containing dielectric layer) on a bottom anti-reflective coating (BARC) layer on a silicon oxide hard mask. In one embodiment, hardmask 91 includes a titanium nitride (TiN) layer, a tungsten carbide (WC) layer, a tungsten bromide carbide (WBC) layer, a carbon hard mask layer, a metal oxide hard mask layer, a metal nitride hard mask layer, a silicon nitride hard mask layer, a silicon oxide hard mask layer, a carbide hard mask layer, other hard mask layer or any combination thereof.

In one embodiment, the photoresist 92 is deposited using one or more of the deposition techniques known to one of ordinary skill in the art of microelectronic device manufacturing. In one embodiment, hardmask 91 is deposited using one or more hard mask layer deposition techniques, such as but not limited to a CVD, PVD, MBE, MOCVD, spin-on, or other hard mask deposition known to one of ordinary skill in the art of microelectronic device manufacturing. In one embodiment, the opening 93 is formed using one or more of the patterning and etching techniques known to one of ordinary skill in the art of microelectronic device manufacturing.

Figure 36A:
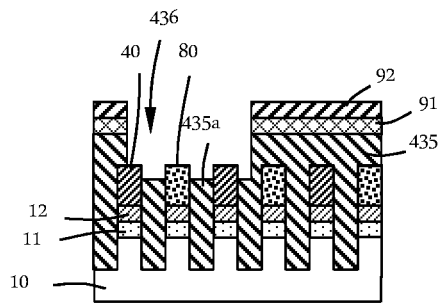
Figure 36B:
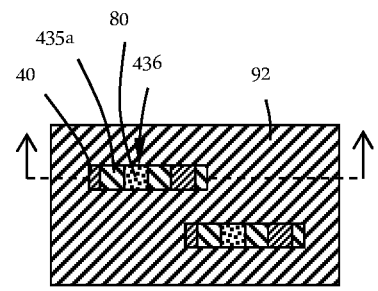

FIGS. 36A and 36B illustrate the device after portions of the hardmask 91 and SOC layer 435 are removed through opening 93 to form an opening 436 in SOC layer 435 according to one embodiment. As shown, the opening 436 reveals the tops of the mandrels 40 and gapfill materials 80. The opening 436 is deep enough so that the SOC layer 435a between the exposed mandrels 40 and gapfill materials 80 is at the same level as the mandrels 40 and gapfill materials 80 or below the top of at least the gapfill materials 80.

Figure 37A:
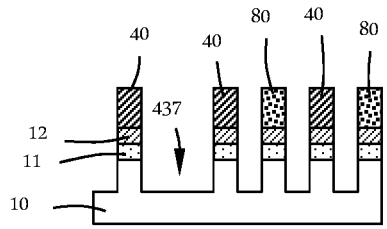
Figure 37B:
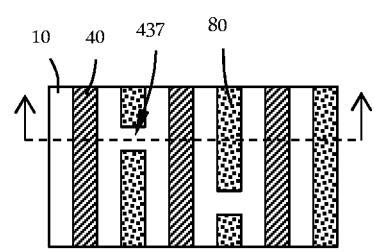

FIGS. 37A and 37B illustrate the device after the film stack topped with gapfill material 80 located within opening 436 has been removed to leave a gap 437 in the substrate 10 where the film stack was located. The photoresist 92, hardmask 91 and SOC layer 435, 435a have also been removed. These materials can be removed by a single process or by multiple processes. In some embodiments, removing the SOC layer 435, 435a is done with a selective etch process that does not substantially affect the mandrels 40 or gapfill materials 80.

In some embodiments, the process of removing the film stack topped with gapfill material 80 comprises selectively etching the gapfill material 80 relative to any exposed mandrels 40. The selective etch process may also be selective to the SOC layer 435, 435a.

The selective etch process which removes the gapfill material 80 has a selectivity greater than or equal to about 10, greater than or equal to about 12, greater than or equal to about 15, greater than or equal to about 20, or greater than or equal to about 25. In some embodiments, the selective etch process has a selectivity of about 12.

Figure 38A:
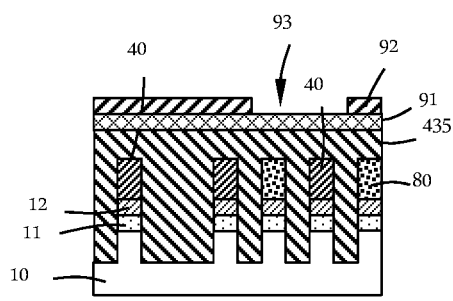
FIGS. 38A through 40B illustrate cross-sectional (A) and top views (B) of an electronic device structure using a wide overlay mask to remove one silicon nitride topped stack according to one or more embodiment of the disclosure.
Figure 38B:
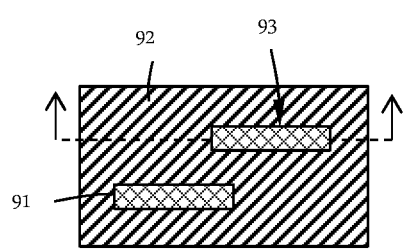

FIGS. 38A and 38B illustrate the device after a SOC layer 435 has been deposited to fill the gaps between the film stacks topped by the mandrels 40 and the gap fill materials 80. The SOC layer 435 is deposited to have an overburden that covers the tops of the mandrels 40 and the gap fill materials 80. A hardmask 91 is formed on the SOC layer 435 and a photoresist 92 with opening 93 is formed on the hardmask 91. The opening 93 is now positioned over one of the film stacks topped with the mandrel 40 and may extend over the film stacks topped with the gapfill material 80.

Figure 39A:
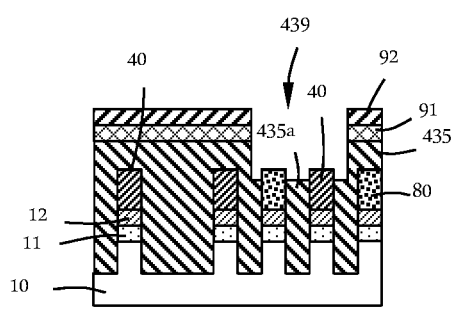
Figure 39B:
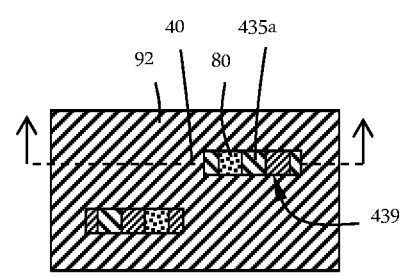

FIGS. 39A and 39B illustrate the device after portions of the hardmask 91 and SOC layer 435 are removed through opening 93 to form an opening 439 in SOC layer 435 according to one embodiment. As shown, the opening 439 reveals the tops of a mandrel 40 and gapfill materials 80. The opening 439 is deep enough so that the SOC layer 435a between the exposed mandrels 40 and gapfill materials 80 is at the same level as the mandrels 40 and gapfill materials 80 or below the top of at least the mandrels 40.

Figure 40A:
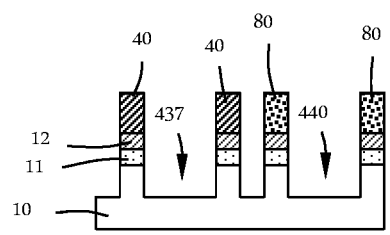
Figure 40B:
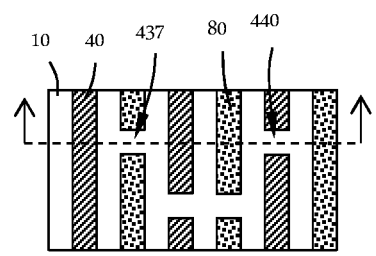

FIGS. 40A and 40B illustrate the device after the film stack topped with mandrel 40 located within opening 439 has been removed to leave a gap 440 in the substrate 10 where the film stack was located. The photoresist 92, hardmask 91 and SOC layer 435, 435a have also been removed. These materials can be removed by a single process or by multiple processes. In some embodiments, removing the SOC layer 435, 435a is done with a selective etch process that does not substantially affect the mandrels 40 or gapfill materials 80.

The remaining mandrels 40, gapfill materials 80 and the etch stop layers 12 and oxide layers 11 below the mandrels 40 and gapfill materials 80 can be removed to provide a substrate 170 as illustrated in FIGS. 17A and 17B.

A fifth aspect of the disclosure may be referred to as a transfer etch AB mask with a cut-last Fin etch. This aspect is illustrated by a process that proceeds from FIGS. 18 through 21, followed by FIGS. 4 through 8, followed by FIGS. 33 through 40, ending in FIG. 17, inclusive of both A and B illustrations.

A sixth aspect of the disclosure may be referred to as a transfer etch and replaced core AB mask with cut-last Fin etch. This aspect is illustrated by a process that proceeds from FIGS. 22 through 32, followed by FIG. 8, followed by FIGS. 33 through 40, ending in FIG. 17, inclusive of both A and B illustrations.

Another embodiment of the disclosure relates to the use of a selective etch process of aluminum oxide in the production of self-aligned gate contacts.

Figure 41:
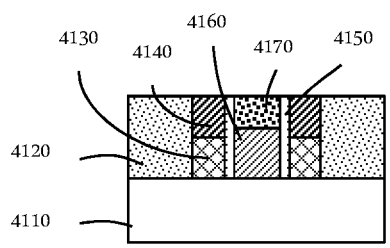
FIGS. 41 and 42 illustrate a cross-sectional view of an electronic device structure comprising source/drain terminals and a metal gate according to one or more embodiment of the disclosure.

FIG. 41 shows a view of an electronic device comprising a substrate 4110, an oxide layer 4120, source/drain regions 4130, capping layer 4140, sidewall spacers 4150, a metal gate 4160 and a metal gate cap 4170. The individual components of the device illustrated in FIG. 41 can be formed by any suitable processes known to the skilled artisan.

In some embodiments, the oxide layer is comprised of a flowable silicon oxide. In some embodiments, the source/drain regions are comprised of cobalt metal. In some embodiments, the source drain cap is comprised of aluminum oxide. In some embodiments, the sidewall spacers are comprised of a low-k material. In some embodiments, the low-k material is selected from SiOC or SiONC. In some embodiments, the metal gate cap is comprised of silicon nitride.

Figure 42:
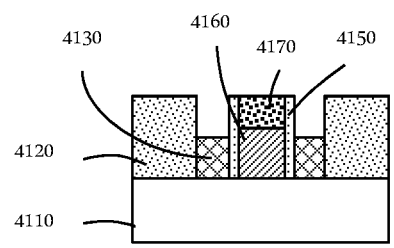

FIG. 42 illustrates the device after the source drain cap has been selectively removed without removal of the oxide layer 4120 or the metal gate cap 4170. In some embodiments, the capping layer 4140 consists essentially of aluminum oxide and the process of selectively removing the capping layer 4140 comprises a selective etch process. The selective etch process which removes the capping layer 4140 has a selectivity greater than or equal to about 10, greater than or equal to about 12, greater than or equal to about 15, greater than or equal to about 20, or greater than or equal to about 25. In some embodiments, the selective etch process has a selectivity of about 12.

Although not illustrated, after removal of the capping layer 4140, additional metal material may be deposited on top of one or more of the source/drain regions. In some embodiments, the additional metal material comprises or consists essentially of cobalt metal.

Some embodiments of the disclosure relates to the use of aluminum oxide as an etch stop layer in the production of electronic devices comprising vias. These embodiments may advantageously provide for the precise control of via critical dimension (CD) and/or profile. These embodiments may advantageously provide for forming vias or openings without impacting surrounding layers.

Figure 43:
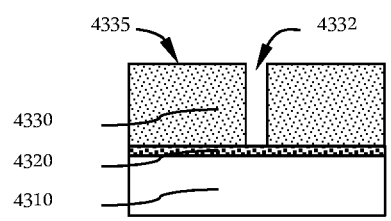
FIGS. 43 and 44 illustrate a cross-sectional view of an electronic device structure comprising a bottom etch stop layer and a deposited layer with a feature according to one or more embodiment of the disclosure.

FIG. 43 shows a view of an electronic device comprising a substrate 4310, an etch stop layer 4320 and a deposited layer 4330. The deposited layer has a feature formed therein such that an opening 4332 extends from the top surface 4335 of the deposited layer 4330 to the etch stop layer 4320. While not illustrated, the device may comprise additional layers between the substrate 4310 and the etch stop layer 4320. The individual components of the device illustrated in FIG. 43 can be formed by any suitable processes known to the skilled artisan.

In some embodiments, the deposited layer 4330 comprises one or more of SiOC, SiO, SiN, spin-on layers, or other low-k materials. In some embodiments, the etch stop layer 4320 comprises aluminum oxide.

Figure 44:
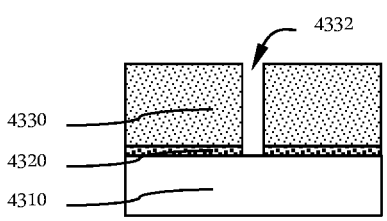

FIG. 44 illustrates the device of FIG. 43 after the bottom of the opening 4332 has been selectively removed. In some embodiments, this removal is performed without impacting the deposited layer 4330. In some embodiments, the etch stop layer 4320 consists essentially of aluminum oxide and the process of selectively removing the etch stop layer comprises a selective etch process. The selective etch process which removes the etch stop layer 4320 has a selectivity greater than or equal to about 10, greater than or equal to about 12, greater than or equal to about 15, greater than or equal to about 20, or greater than or equal to about 25. In some embodiments, the selective etch process has a selectivity of about 12.

Another embodiment of the disclosure relates to the use of aluminum oxide as a liner layer in the production of electronic devices comprising vias and/or vias contacts. These embodiments may advantageously provide for the maximization of contact area.

Figure 45:
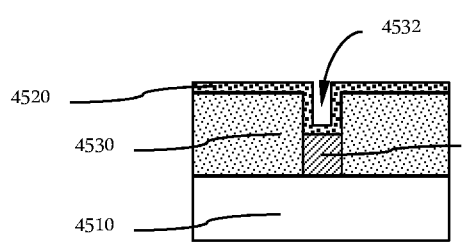
FIGS. 45 and 46 illustrate a cross-sectional view of an electronic device structure comprising a deposited layer, a metal contact and a liner layer according to one or more embodiment of the disclosure.

FIG. 45 shows a view of an electronic device comprising a substrate 4510 and a deposited layer 4530. The deposited layer has a via 4532 formed therein which has a metal contact 4540 at the bottom of the via. The deposited layer and the metal contact are covered by a liner 4520. While not illustrated, the device may comprise additional layers between the substrate 4510 and the deposited layer 4530 and/or the metal contact 4540. The individual components of the device illustrated in FIG. 45 can be formed by any suitable processes known to the skilled artisan.

In some embodiments, the deposited layer 4530 comprises one or more of SiOC, SiO, SiN, spin-on layers, or other low-k materials. In some embodiments, the liner 4520 comprises aluminum oxide.

Figure 46:
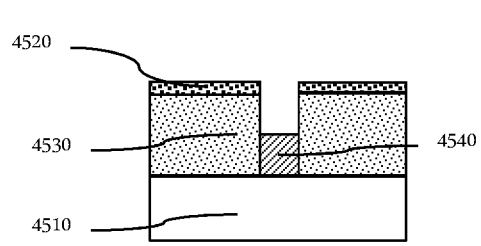

FIG. 46 illustrates the device of FIG. 45 after the liner 4520 has been selectively removed. In some embodiments, as shown in FIG. 46, the liner 4520 is removed from only the bottom and sidewalls of the via 4532. In some embodiments, not shown, the entire liner 4520, or substantially all of the liner 4520 (e.g., >95%) is removed from the electronic device. The removal of the liner 4520 is performed without impacting the deposited layer 4530 or the metal contact 4540. In some embodiments, the liner 4520 consists essentially of aluminum oxide and the process of selectively removing the liner 4520 comprises a selective etch process. The selective etch process which removes the liner 4520 has a selectivity greater than or equal to about 10, greater than or equal to about 12, greater than or equal to about 15, greater than or equal to about 20, or greater than or equal to about 25. In some embodiments, the selective etch process has a selectivity of about 12.

In the foregoing specification, embodiments of the invention have been described with reference to specific exemplary embodiments thereof. It will be evident that various modifications may be made thereto without departing from the broader spirit and scope of the embodiments of the invention as set forth in the following claims. The specification and drawings are, accordingly, to be regarded in an illustrative sense rather than a restrictive sense.

What is claimed is:

1. A method of forming a semiconductor device, the method comprising:
   forming a first spin-on-carbon layer, a first hardmask and a first photoresist on a film comprising alternating columns of spacer mandrels and gapfill materials with oxide films between, the first photoresist having an opening over one of the gapfill materials and the gapfill materials comprising aluminum oxide;
   etching the first hardmask and the first spin-on-carbon layer through the opening in the first photoresist to expose a top surface of one of the gapfill materials;
   removing the first spin-on-carbon layer, the first hardmask and the one of the gapfill materials to leave a gap;
   forming a second spin-on-carbon layer, a second hardmask and a second photoresist on the film comprising alternating columns of spacer mandrels, gapfill materials, oxide films and the gap, the second photoresist having an opening over one of the spacer mandrels;
   etching the second hardmask and the second spin-on carbon layer through the opening in the second photoresist to expose a top surface of one of the spacer mandrels;
   removing the second spin-on-carbon layer, the second hardmask and the one of the spacer mandrels to leave another gap;
   removing the oxide films to leave the spacer mandrels and the gapfill materials on a first etch stop layer on a first oxide layer on a substrate;
   etching to remove the first etch stop layer and the first oxide layer not covered by the spacer mandrels or the gapfill materials and reducing a height of the spacer mandrels and gapfill materials to expose portions of the substrate; and
   fin etching the exposed portions of the substrate and removing the remaining spacer mandrels, the gapfill materials, the first etch stop layer and the first oxide layer.

2. The method of claim 1, wherein prior to forming the second spin-on-carbon layer the method further comprises:
   forming mandrels in an amorphous silicon layer on the first etch stop layer;
   forming a conformal spacer layer on the mandrels;
   removing the mandrels and square etching the conformal spacer layer to form the spacer mandrels on the first etch stop layer;
   forming a conformal oxide layer on the spacer mandrels;
   etching the conformal oxide layer to form the oxide films on both sides of the spacer mandrels with gaps between the adjacent oxide films; and
   depositing flail the gapfill materials in the gaps between adjacent oxide films.

3. The method of claim 2, wherein the first oxide layer on the substrate comprises silicon oxide.

4. The method of claim 2, wherein the spacer mandrels comprise silicon nitride.

5. The method of claim 2, wherein the gapfill material is removed by an etch process with a selectivity greater than or equal to about 12.

6. The method of claim 2, wherein the oxide films comprise silicon oxide.

7. The method of claim 2, wherein the conformal spacer layer comprises silicon nitride.

8. The method of claim 1, wherein prior to forming the second spin-on-carbon layer, the method further comprises:
  forming mandrels in a third spin-on-carbon layer on a second etch stop layer on a silicon nitride layer on the first etch stop layer on the oxide layer on the substrate;
  forming a conformal spacer layer on the mandrels;
  removing the mandrels and square etching the conformal spacer layer to form spacer mandrels on the second etch stop layer;
  transferring the spacer mandrels on the second etch stop layer to the silicon nitride layer to form the spacer mandrels and expose the first etch stop layer; removing the spacer mandrels on the second etch stop layer and the remaining portions of the second etch stop layer;
  forming a conformal oxide layer on the spacer mandrels on the second etch stop layer;
  etching the conformal oxide layer to form the oxide films on both sides of the spacer mandrels with Hall gaps between the adjacent oxide films; and
  depositing flail the gapfill material in the gaps between adjacent oxide films.

9. The method of claim 8, wherein the oxide layer on the substrate comprises silicon oxide.

10. The method of claim 8, wherein the spacer mandrels comprise silicon nitride.

11. The method of claim 8, wherein the gapfill material is removed by an etch process with a selectivity greater than or equal to about 12.

12. The method of claim 8, wherein the oxide films comprise silicon oxide.

13. The method of claim 8, wherein the conformal spacer layer comprises silicon nitride.

14. The method of claim 1, wherein prior to forming the second spin-on-carbon layer, the method further comprises:
  forming mandrels in a fourth spin-on-carbon layer on a second etch stop layer on an amorphous silicon layer on the first etch stop layer on the first oxide layer on the substrate;
  forming a conformal spacer layer on the mandrels in the fourth spin-on-carbon layer;
  removing the mandrels in the fourth spin-on-carbon layer and square etching the conformal spacer layer to form spacer mandrels on the second etch stop layer;
  transferring the spacer mandrels on the second etch stop layer to the amorphous silicon layer to form amorphous silicon spacer mandrels and expose the second etch stop layer;
  removing the spacer mandrels on the second etch stop layer and the remaining portions of the second etch stop layer;
  forming a conformal oxide layer on the amorphous silicon spacer mandrels on the first etch stop layer;
  etching the conformal oxide layer to form the oxide films on both sides of the amorphous silicon spacer mandrels with gaps between the adjacent oxide films;
  depositing flail the gapfill materials in the gaps between adjacent oxide films;
  removing the amorphous silicon spacer mandrels leaving gaps between adjacent oxide films; and
  depositing a silicon nitride film in the gaps between the adjacent oxide films to form the spacer mandrels.

15. The method of claim 14, wherein the spacer mandrels comprise silicon nitride.

16. The method of claim 14, wherein the gapfill material is removed by an etch process with a selectivity greater than or equal to about 12.

17. The method of claim 14, wherein the oxide films comprise silicon oxide.

* * * * *

UNITED STATES PATENT AND TRADEMARK OFFICE
CERTIFICATE OF CORRECTION

PATENT NO. : 10,692,728 B2  
APPLICATION NO. : 16/144261  
DATED : June 23, 2020  
INVENTOR(S) : Qingjun Zhou et al.

Page 1 of 1

It is certified that error appears in the above-identified patent and that said Letters Patent is hereby corrected as shown below:

In the Specification

In Column 6, Line 64, insert --12-- after "etch stop layer".

In the Claims

Column 16, Line 55, delete "flail" after "depositing" and before "the gapfill".

Column 17, Line 19, delete "Hall" after "with" and before "gaps".

Column 17, Line 21, delete "flail" after "depositing" and before "the gapfill".

Column 18, Line 22, delete "flail" after "depositing" and before "the gapfill".

Signed and Sealed this  
First Day of September, 2020

Andrei Iancu  
*Director of the United States Patent and Trademark Office*